(12) United States Patent
Feng et al.

(10) Patent No.: US 10,804,479 B2
(45) Date of Patent: Oct. 13, 2020

(54) ORGANIC THIN FILM TRANSISTOR STRUCTURE AND MANUFACTURING METHOD, GAS SENSOR AND RELATED APPARATUS

(71) Applicants: Beijing BOE Display Technology Co., Ltd., Beijing (CN); BOE Technology Group Co., Ltd., Beijing (CN)

(72) Inventors: Xiang Feng, Beijing (CN); Zhaokun Yang, Beijing (CN); Qinghe Wang, Beijing (CN); Sha Liu, Beijing (CN); Ruizhi Yang, Beijing (CN); Qiang Zhang, Beijing (CN); Chunyan Xie, Beijing (CN); Yun Qiu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/329,274

(22) PCT Filed: Jun. 21, 2018

(86) PCT No.: PCT/CN2018/092243
§ 371 (c)(1),
(2) Date: Feb. 28, 2019

(87) PCT Pub. No.: WO2019/033847
PCT Pub. Date: Feb. 21, 2019

(65) Prior Publication Data
US 2019/0252629 A1    Aug. 15, 2019

(30) Foreign Application Priority Data

Aug. 15, 2017  (CN) .......................... 2017 1 0696196

(51) Int. Cl.
*H01L 51/05*        (2006.01)
*G02F 1/1362*     (2006.01)
(Continued)

(52) U.S. Cl.
CPC ....... *H01L 51/0512* (2013.01); *G01N 27/414* (2013.01); *G01N 27/4141* (2013.01);
(Continued)

(58) Field of Classification Search
CPC ............. H01L 51/0512; H01L 27/3225; H01L 51/0516; H01L 27/32; H01L 51/105;
(Continued)

(56) References Cited

U.S. PATENT DOCUMENTS

2017/0000358 A1*  1/2017  Bae .................... A61B 5/02055
2017/0110665 A1*  4/2017  Kanesaka ................ C08K 5/45

FOREIGN PATENT DOCUMENTS

CN     102789985 A     11/2012
CN     103490010 A      1/2014
(Continued)

OTHER PUBLICATIONS

International Search Report for Application No. PCT/CN2018/0922343, dated Sep. 20, 2018, 3 pgs.

*Primary Examiner* — Su C Kim
(74) *Attorney, Agent, or Firm* — Arent Fox LLP; Michael Fainberg (57) ABSTRACT

Disclosed by the present disclosure are an organic thin film transistor structure and a manufacturing method, a gas sensor, and a related apparatus: a gap, which contacts an organic active layer and which is used for accommodating a gas to be detected, is provided in the organic thin film transistor structure.

16 Claims, 7 Drawing Sheets

(51) Int. Cl.
*H01L 27/32* (2006.01)
*G01N 27/414* (2006.01)
*H01L 51/10* (2006.01)
*H01L 51/00* (2006.01)

(52) U.S. Cl.
CPC ............ *G02F 1/1362* (2013.01); *H01L 27/32* (2013.01); *H01L 27/3225* (2013.01); *H01L 51/0516* (2013.01); *H01L 51/105* (2013.01); *H01L 27/3262* (2013.01); *H01L 51/0036* (2013.01)

(58) Field of Classification Search
CPC ............ H01L 51/0036; H01L 27/3262; H01L 51/0508; H01L 51/102; G01N 27/414; G01N 27/4141; G02F 1/1362
See application file for complete search history.

(56) References Cited

FOREIGN PATENT DOCUMENTS

| CN | 105699463 A | 6/2016 |
|----|-------------|--------|
| CN | 103500798 A | 8/2016 |
| JP | 2008172028 A | 7/2008 |

\* cited by examiner

ORGANIC THIN FILM TRANSISTOR STRUCTURE AND MANUFACTURING METHOD, GAS SENSOR AND RELATED APPARATUS

CROSS-REFERENCE TO RELATED APPLICATIONS

The present disclosure is a National Stage of International Application No. PCT/CN2018/092243, filed on Jun. 21, 2018, which claims the priority of No. 201710696196.6 Chinese patent application which has the title "Sensor and Manufacturing Method Thereof, Array Substrate, Display Panel and Display Device" and which is filed to China Patent Office on Aug. 15, 2017. The above applications are hereby incorporated by reference, in their entireties, into the present disclosure.

FIELD

The present disclosure relates to the technical field of thin film transistor, in particular to the structure and manufacturing method of an organic thin film transistor, a gas sensor and a related apparatus.

BACKGROUND

The Organic Thin Film Transistor (OTFT) has the advantages of being low-cost and environment friendly and can be easily mass-produced. The gas sensor is an essential element in industrial production and smart home. At present, sensor application has been proved to be a good destination for OTFT technology. When the gas to be detected enters the carrier migration interface of the OTFT, it can affect the interface between the organic active layer and insulating layer so as to affect the carrier migration velocity of the OTFT, resulting in the reduction of the OTFT carrier mobility, and the decrease degree of the carrier is related to the concentration of the gas, that is to say, when meeting the gas to be detected, the OTFT has the characteristic of having significant change in mobility (becoming worse). Hence, the OTFT device can be applied to the gas sensor to detect the gas concentration, and the OTFT can take advantage of its low-cost feature especially in the application of disposable gas sensors.

SUMMARY

The present disclosure discloses in the Embodiments the structure of an organic thin film transistor, including:
 a gate electrode;
 an organic active layer overlapping mutually with the gate electrode in a thickness direction of the gate electrode;
 a source-drain electrode connected with the organic active layer, and
 a gate insulating layer which is between the gate electrode and the organic active layer, wherein the gate insulating layer includes a gap arranged in contact with the organic active layer and configured to accommodate a gas to be detected.

Optionally, the gap in the organic thin film transistor structure provided in the embodiments of the present disclosure passes through the gate insulating layer in a thickness direction of the gate insulating layer.

Optionally, the gap in the organic thin film transistor structure provided in the embodiments of the present disclosure includes a plurality of strip gaps extending substantially in a same direction;

The strip gaps overlap mutually with the organic active layer in a thickness direction of the organic active layer.

Optionally, in the organic thin film transistor structure provided in the embodiments of the present disclosure, ends of the strip gaps along a length direction do not overlap with the organic active layer in a thickness direction of the organic active layer.

Optionally, in the organic thin film transistor structure provided in the embodiments of the present disclosure, spaces between any two adjacent strip gaps are same.

Optionally, in the organic thin film transistor structure provided in the embodiments of the present disclosure, the gate insulating layer further includes a plurality of sub-insulating layers separated by the strip gaps; spaces between any two adjacent sub-insulating layers are same.

Optionally, in the organic thin film transistor structure provided in the embodiments of the present disclosure, a material of the organic active layer is a donor-acceptor conjugated polymer PBIBDF-BT.

Optionally, in the organic thin film transistor structure provided in the embodiments of the present disclosure, a material of the gate insulating layer includes silicon nitride.

Optionally, in the organic thin film transistor structure provided in the embodiments of the present disclosure, the gate insulating layer is on the gate electrode, the organic active layer is on the gate insulating layer, and the source-drain electrode is on the organic active layer.

On the other hand, the present disclosure further provides in the embodiments a gas sensor with the above-described organic thin film transistor structure.

On the other hand, the present disclosure further provides in the embodiments a display panel including an array substrate, and a gas sensor arranged in a non-display area of the array substrate.

On the other hand, the present disclosure further provides in the embodiments a display device including the above-described display panel.

On the other hand, the present disclosure further provides in the embodiments a manufacturing method of the organic thin film transistor structure, including:
 forming a pattern of a gate electrode;
 forming a gate insulating layer on the pattern of the gate electrode;
 etching the gate insulating layer to form a gap in the gate insulating layer for accommodating a gas to be detected;
 filling the gap with a filling material to obtain a composite layer formed by the filling material and the gate insulating layer;
 forming a pattern of an organic active layer and a pattern of a source-drain electrode on the composite layer, and removing the filling material by a cleaning fluid.

Optionally, in the method provided in the embodiments of the present disclosure, the filling material includes poly (1, 4-butylene adipate).

Optionally, in the method provided in the embodiments of the present disclosure, the cleaning fluid comprises one or a combination of the following materials: acetone and ethyl acetate.

EMBODIMENT

The present disclosure provides in the embodiments the structure and manufacturing method of an organic thin film transistor, a gas sensor and a related device to improve the sensitivity of the gas sensor for detecting the gas concentration and the detection effect on gas concentration.

Figure 1:
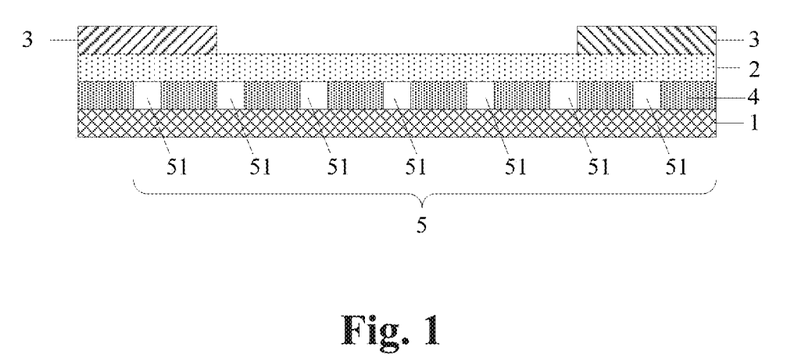
FIG. 1 is a schematic diagram of the organic thin film transistor structure provided in some embodiments of the present disclosure.

The present disclosure provides in the embodiments the organic thin film transistor structure, as shown in FIG. 1, including:

a gate electrode 1;

an organic active layer 2 overlapping mutually with the gate electrode 1 in the thickness direction of the gate electrode 1;

a source-drain electrode 3 connected with the organic active layer 2; and a gate insulating layer 4 arranged between the gate electrode 1 and the organic active layer 2, wherein the gate insulating layer 4 includes a gap 5 arranged in contact with the organic active layer 2 and configured to accommodate the gas to be detected.

Optionally, the gap 5 arranged in contact with the organic active layer 2 and configured to accommodate the gas to be detected is set in the organic thin film transistor structure disclosed in the embodiments of the present disclosure. When the organic thin film transistor structure is used to detect the gas concentration, the gas to be detected can enter the interior of the organic thin film transistor structure through the gap 5 and the contact area between the gas to be detected and the organic active layer 2 is increased, thus the contact area between the gas to be detected and a carrier migration interface is increased. Accordingly, the sensitivity of the organic thin film transistor structure to detect the concentration of the gas to be detected and the detection effect on gas concentration are improved.

Optionally, in the organic thin film transistor structure disclosed in the Embodiments of the present disclosure, as shown in FIG. 1, the gap 5 passes through the gate insulating layer 4 in the thickness direction of the gate insulating layer 4 so as to increase as much as possible the space for accommodating the gas to be detected, which is helpful for the sufficient contact between the gas to be detected and the organic active layer 2, thus the contact area between the gas to be detected and the carrier migration interface is increased. Accordingly, the sensitivity of the organic thin film transistor structure to detect the concentration of the gas to be detected and the detection effect on gas concentration are improved.

Figure 2:
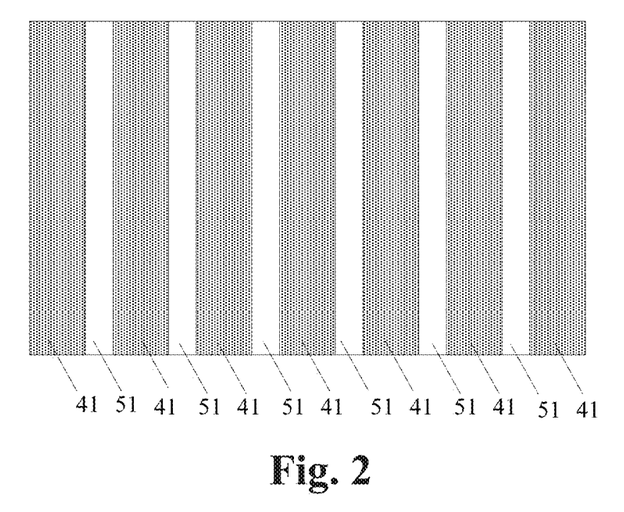
FIG. 2 is a projection schematic diagram of the sub-insulating layers and strip gaps perpendicular to the direction of the gate electrode in the organic thin film transistor structure provided in some embodiments of the present disclosure.
Figure 3:
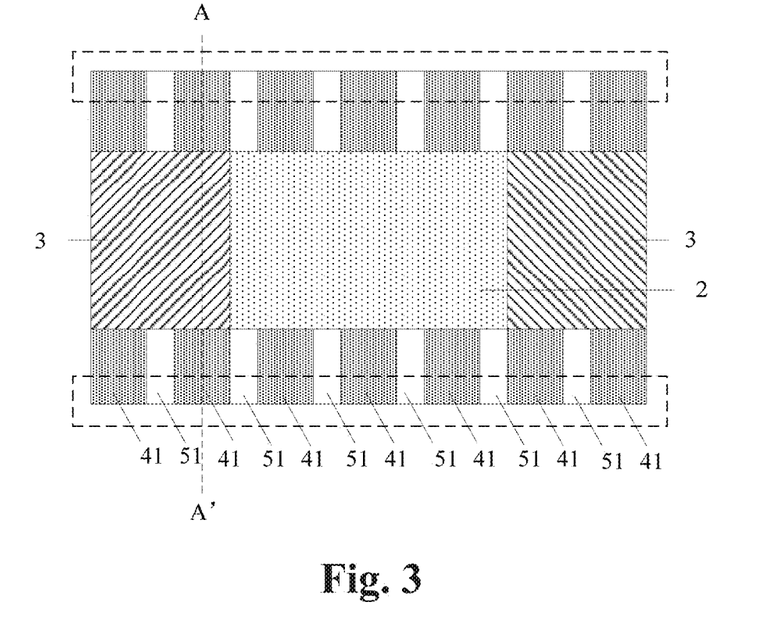
FIG. 3 is a top view of the organic thin film transistor structure provided in some embodiments of the present disclosure.
Figure 4:
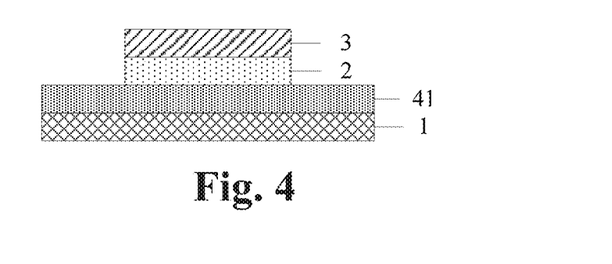
FIG. 4 is a cross-section of the organic thin film transistor structure provided in some embodiments of the present disclosure along AA' in FIG. 3.

Optionally, in the organic thin film transistor structure disclosed in the Embodiments of the present disclosure, as shown in FIG. 1-FIG. 3, the gap 5 includes a plurality of strip gaps 51 extending substantially in the same direction;

The strip gaps 51 overlap mutually with the organic active layer 2 in the thickness direction of the organic active layer 2.

Optionally, a plurality of strip gaps 51 in mutual contact with the organic active layer 2 can ensure the sufficient contact between the gas to be detected and each area of the organic active layer 2, thus the contact area between the gas to be detected and the carrier migration interface is increased. Accordingly, the sensitivity of the organic thin film transistor structure to detect the concentration of the gas to be detected and the detection effect on gas concentration are improved.

Optionally, in the organic thin film transistor structure disclosed in the embodiments of the present disclosure, as shown in FIG. 3, the ends of the strip gaps 51 along the length direction (as shown in the dotted box in FIG. 3) do not overlap with the organic active layer 2 in the thickness direction of the organic active layer 2, that is, the ends of the strip gaps 51 along the length direction protrude from the organic active layer 2 so that the gas to be detected can enter from the ends of the strip gaps 51 along the length direction, which is helpful for the sufficient contact between the gas to be detected and the organic active layer 2, thus the contact area between the gas to be detected and the carrier migration interface is increased. Accordingly, the sensitivity of the organic thin film transistor structure to detect the concentration of the gas to be detected and the detection effect on gas concentration are improved.

Optionally, in the organic thin film transistor structure provided in the embodiments of the present disclosure, the spaces between any two adjacent strip gaps 51 are equal. Thus, the strip gaps 51 are uniformly arranged in the gate insulating layer 4. When the organic thin film transistor structure provided in the embodiments of the present disclosure is configured to detect the gas concentration, the gas to be detected can be evenly distributed on the carrier migration interface of the organic thin film transistor structure, thus making the gas concentration detection result more accurate.

Optionally, in the organic thin film transistor structure provided in the Embodiments of the present disclosure, as shown in FIG. 2, the gate insulating layer 4 also includes a plurality of sub-insulating layers 41 separated by the strip gaps 51; the spaces between any two adjacent sub-insulating layers 41 are same. Thus, it can ensure that the strip gaps 51 are uniformly arranged in the gate insulating layer 4. When the organic thin film transistor structure provided in the embodiments of the present disclosure is configured to detect the gas concentration, the gas to be detected can be evenly distributed on the carrier migration interface of the organic thin film transistor structure, thus making the gas concentration detection result more accurate.

Optionally, in the organic thin film transistor structure provided in the embodiments of the present disclosure, the material of the organic active layer 2 can be selected from a donor-acceptor conjugated polymer (PBIBDF-BT).

Figure 5:
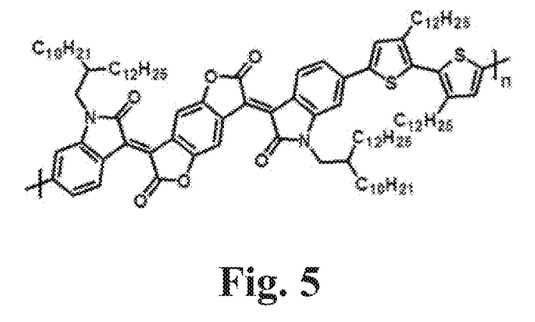
FIG. 5 is a molecular structure diagram of PBIBDF-BT in the organic thin film transistor structure provided in some embodiments of the present disclosure.

Optionally, the molecular structure of the PBIBDF-BT is shown in FIG. 5. The PBIBDF-BT is sensitive to the common gases including ammonia gas and sulfur dioxide that need to be detected in daily life. In addition, the PBIBDF-BT can also be used for the detection of ethanol, acetone, ether, n-hexane, methylbenzene, ethyl acetate, isopropanol, chloroform and other gases.

It should be noted that, for a certain kind of organic semiconductor material, it may only be sensitive to certain gases. When selecting the material for the organic active layer 2 of the organic thin film transistor structure, what needs to consider is what kind of gas needs to be detected when the material is applied in gas sensors, and then the material that is sensitive to that kind of gas is selected as the material for the organic active layer 2.

Optionally, in the organic thin film transistor structure provided in the embodiments of the present disclosure, the material of the gate insulating layer 4 includes silicon nitride (SiNx).

Optionally, the organic thin film transistor structure provided in the embodiments of the present disclosure can be a bottom-gate type structure. Optionally, as shown in FIG. 1, the gate insulating layer 4 is arranged to cover the gate electrode 1, the organic active layer 2 is arranged to cover the gate insulating layer 4, and the source-drain electrode 3 is arranged on the organic active layer 2. Thus, in addition to contacting the organic active layer 2 through the gap 5, the gas to be detected can also contact the organic active layer 2 through the upper surface of the organic active layer 2 so as to increase the contact area between the gas to be detected and the carrier migration interface. Accordingly, the sensitivity of the organic thin film transistor structure to detect the concentration of the gas to be detected and the detection effect on gas concentration are improved.

Alternatively, the organic thin film transistor structure provided in the Embodiments of the present disclosure can also be a top-gate type structure which is not be defined herein.

Based on the same invention concept, the embodiments of the present disclosure further provide a gas sensor including the above-described organic thin film transistor structure provided in the embodiments of the present disclosure.

Optionally, when the gas sensor provided in the embodiments of the present disclosure is configured to detect the gas concentration, the OTFT is in normal working condition before the gas to be detected enters the organic thin film transistor structure (OTFT), and the carrier mobility of the OTFT in this condition is a. When the gas to be detected enters the organic thin film transistor structure, the gas to be detected is in contact with the organic active layer 2 through the gap 5 so that the gaseous environment of the carrier migration interface changes, which is equivalent to that the carrier migration interface of the organic thin film transistor structure under the normal working condition is polluted by the gas to be detected, and the OTFT is in the abnormal working condition. The carrier mobility of the OTFT in the abnormal working condition is b. Compared with the OTFT in the normal working condition, the carrier mobility of the OTFT decreases, and the carrier mobility b is far less than a with the increase of the gas concentration. Therefore, the concentration of the gas to be detected in the environment can be judged according to the difference between b and a. The larger the difference between b and a is, the higher the gas concentration is; otherwise, the lower the gas concentration is.

Figure 6:
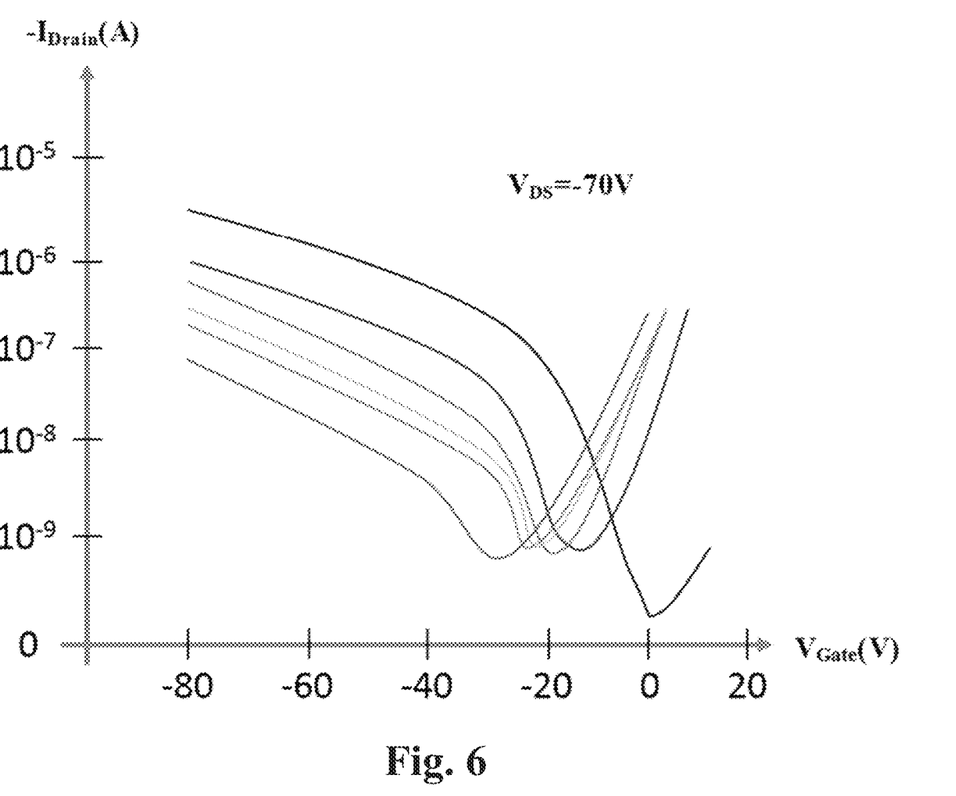
FIG. 6 is a curve diagram of the transfer characteristic of the organic thin film transistor corresponding to different gas concentrations as provided in some embodiments of the present disclosure.

For a certain kind of gas, the influence of gas concentration on the OTFT carrier mobility can be reflected as the influence of gas concentration on the OTFT transfer characteristic curve. When the gas concentration is different, the transfer characteristic curve is also different. Take the organic active layer of the OTFT, which is the PBIBDF-BT for example. As shown in FIG. 6, seen from the far left of FIG. 6, the OTFT transfer characteristic curves corresponding to different concentrations of the ammonia gas are shown from top to bottom. And the concentrations of the ammonia gas corresponding to the curves decrease from top to bottom: the uppermost curve corresponds to the OTFT transfer characteristic curve when the ammonia concentration percentage (parts per billion, ppm) is 0, the bottom curve corresponds to the OTFT transfer characteristic curve when the ammonia ppm is 50. When the driving voltage of the OTFT is constant and ppm is 0, OTFT's Ion is the largest, and when ppm of the ammonia gas is 50, OTFT's Ion is the smallest. The OTFT transfer characteristic curves for any kind of gas under different concentrations can be measured in advance; therefore, the relationship between the gas concentration and OTFT Ion under the same driving voltage can be fitted according to the pre-measured OTFT transfer characteristic curves of the gases with different concentrations. So when the OTFT is used to detect the gas concentration, the gas concentration can be determined according to the relationship between the gas concentration and OTFT Ion.

Based on the same disclosure concept, the present disclosure further provides in the embodiments a display panel including an array substrate, and the above-described gas sensor arranged in a non-display area of the array substrate.

Optionally, the above-described display panel provided in the embodiments of the present disclosure can be a liquid crystal display panel or an organic light-emitting diode display panel.

Figure 7:
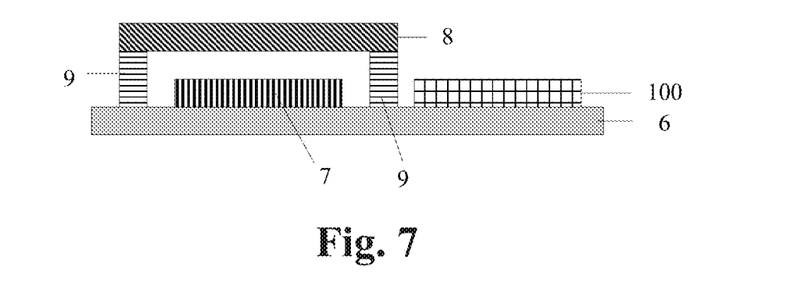
FIG. 7 is a structural diagram of the display panel provided in some embodiments of the present disclosure.

Optionally, in the above-described display panel provided in the Embodiments of the present disclosure, as shown in FIG. 7, the array substrate includes: a base substrate 6, a display structure 7 arranged on the base substrate 6 to realize the display function, a gas sensor 100 arranged on the base substrate 6, an upper substrate 8 arranged above the display structure 7, and an encapsulating material 9 for encapsulating the upper substrate 8 and the base substrate 6.

When the display panel provided in the embodiments of the present disclosure is a liquid crystal display panel, it may be encapsulated with sealant; when the display panel provided in the embodiments of the present disclosure is an OLED display panel, it may be encapsulated with Frit. The material of the base substrate 6 and the upper substrate 8 can be, for example, glass. If the display panel is flexible liquid crystal display panel, the base substrate 6 and the upper substrate 8 can be selected from the flexible materials such as polyimide (PI), polyethylene terephthalate (PET) or polyethylene naphthalate (PEN).

It should be noted that the gas sensor can be set at any position of the display panel as long as it does not affect the display effect. For example, the position of the gas sensor can be planned and set in the non-display area of the display panel. In addition, the number of gas sensors can also be selected according to actual needs, and the present disclosure does not define it.

Based on the same invention concept, the present disclosure further provides in the embodiments a display device including the above-described display panel provided in the embodiments of the present disclosure.

For example, the display device provided in the embodiments of the present disclosure can be a display device such as a mobile phone, a television, and a tablet computer, etc.

The display device provided in the embodiments of the present disclosure also has the function of detecting the gas concentration since it has been set with the above-described gas sensor provided in the embodiments of the present disclosure. In daily life, the user may come into contact with some harmful gases. With the above-described display device provided in the embodiments of the present disclosure, the user can detect whether there is some kind of harmful gas in the current environment, and leave timely in the presence of harmful gas according to the test result to prevent harm to health caused by the harmful gas.

Figure 8:
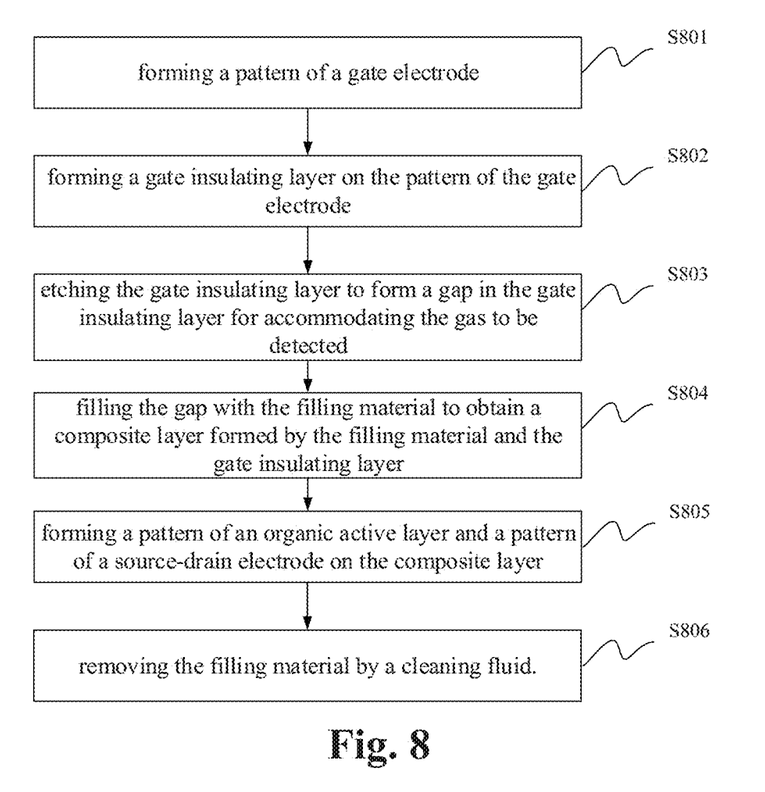
FIG. 8 is a flow chart of the manufacturing method of the organic thin film transistor provided in some embodiments of the present disclosure.

Corresponding to the organic thin film transistor structure provided in the embodiments of the present disclosure, the embodiments of the present disclosure further provide a manufacturing method of the organic thin film transistor structure, as shown in FIG. 8, including:

S801, forming a pattern of the gate electrode;

S802, forming a gate insulating layer on the pattern of the gate electrode;

S803, etching the gate insulating layer to form a gap in the gate insulating layer for accommodating the gas to be detected;

S804, filling the gap with the filling material to obtain a composite layer formed by the filling material and the gate insulating layer;

S805, forming a pattern of an organic active layer and a pattern of a source-drain electrode on the composite layer; and S806, removing the filling material by a cleaning fluid.

Optionally, in the preparation method of the above-described organic thin film transistor structure provided in the embodiments of the present disclosure, the gap configured to accommodate the gas to be detected is set in the gate insulating layer. When the organic thin film transistor structure prepared by this method is used to detect the gas concentration, the gas to be detected can enter the interior of the organic thin film transistor structure through the gap and the contact area between the gas to be detected and the carrier migration interface of the organic thin film transistor structure is increased, and the sensitivity of the organic thin film transistor structure to detect the concentration of the gas to be detected is improved. Accordingly, the sensitivity to detect the concentration of the gas to be detected and the detection effect on gas concentration are improved.

It should be noted that, in the manufacturing method in the embodiments of the present disclosure, suitable filling materials and the corresponding cleaning fluid can be selected according to the material of each membrane layer of the organic thin film transistor structure so that the cleaning fluid in step S806 can only dissolve the filling material without affecting the other membrane layers of organic thin film transistor structure.

Optionally, in the preparation method provided in the embodiments of the present disclosure, the process is simple and easy to implement, and the cleaning fluid only dissolves the filling material without affecting the performance of the organic thin film transistor structure.

Figure 9:
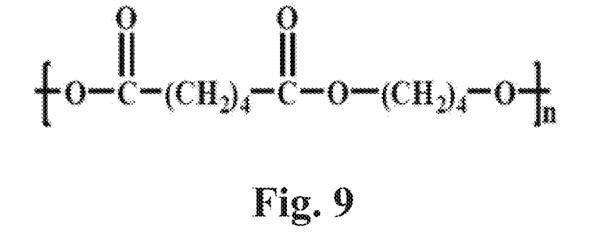
FIG. 9 is a molecular structure diagram of PBA in the manufacturing method of the organic thin film transistor provided in some embodiments of the present disclosure.

Optionally, in the above manufacturing method provided in the embodiments of the present disclosure, the filling material can be selected from polymer insulating materials, and the filling material includes poly(1,4-butylene adipate) (PBA), and the molecular structure formula of PBA is shown in FIG. 9.

Optionally, in the method provided in the Embodiments of the present disclosure, the cleaning fluid includes one or a combination of the following materials: acetone and ethyl acetate.

The following embodiments are used to illustrate the manufacturing method of the above-described organic thin film transistor structure provided in the embodiments of the present disclosure: the material of the gate insulating layer is SiNx, the material of the organic active layer is PBIBDF-BT, the filling material is PBA, and the cleaning fluid is acetone.

Figure 10:
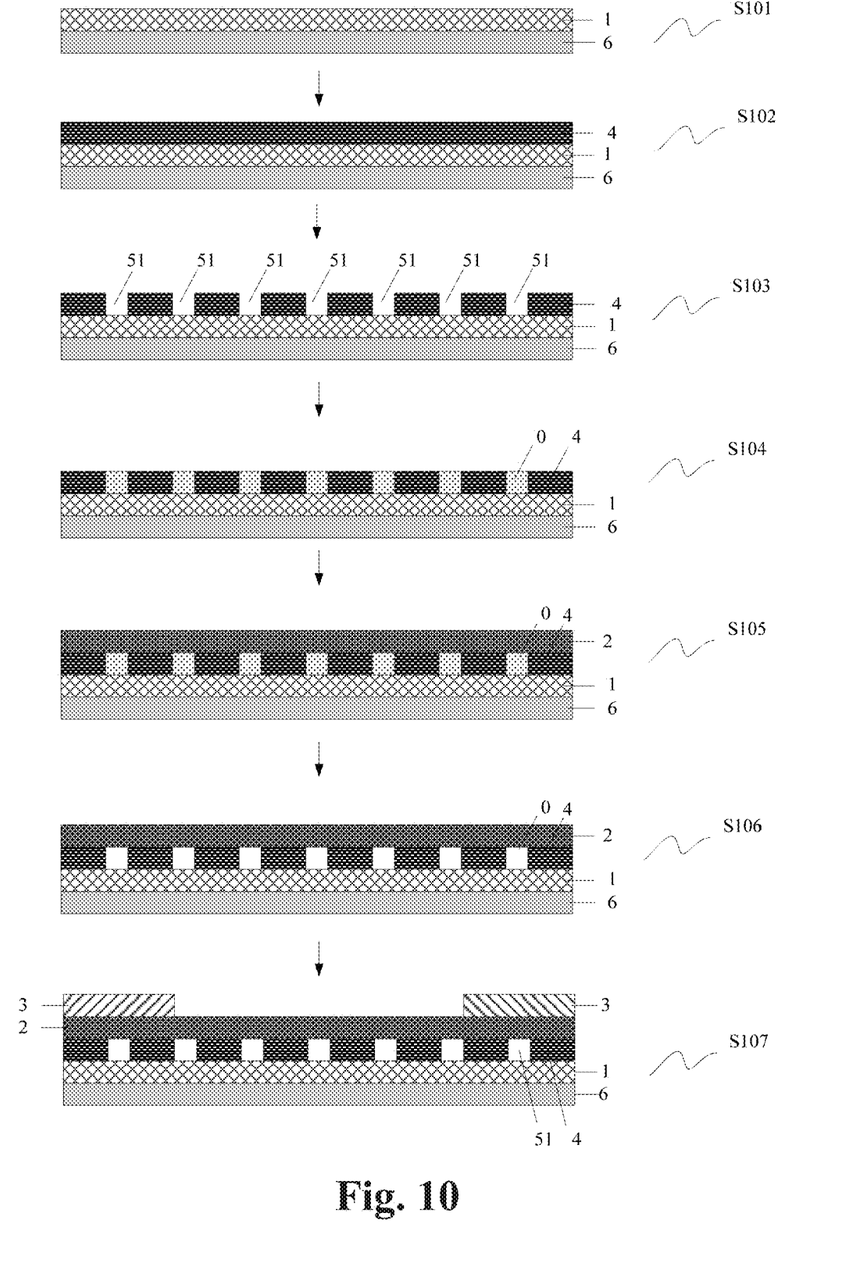
FIG. 10 is a structure diagram after the completion of each step in the manufacturing method of the organic thin film transistor provided in some embodiments of the present disclosure.

As shown in FIG. 10, the manufacturing method of the organic thin film transistor structure provided in the embodiments of the present disclosure includes the following steps:

S101, forming a gate electrode 1 on an base substrate 6;

S102, forming $SiN_x$ 4 on the gate electrode 1; wherein the thickness of the $SiN_x$ layer is 4000 Å;

S103, etching the $SiN_x$ 4, forming a plurality of strip gaps 51 in the $SiN_x$ 4;

S104, filling the strip gaps 51 with PBA 0 by coating process; obtaining a $SiN_x$-PBA composite layer formed by the PBA 0 and $SiN_x$ 4;

S105, depositing PBIBDF-BT 2 on the $SiN_x$-PBA composite layer by inkjet printing process;

S106, dissolving the PBA 0 with acetone to obtain a $SiN_x$-gap composite layer formed by the $SiN_x$ 4 and strip gaps 51;

S107, setting a source-drain electrode 3 on PBIBDF-BT 2.

In the manufacturing method of the organic thin film transistor structure provided in the embodiments of the present disclosure, as shown in FIG. 10, the material of the organic active layer of the organic thin film transistor structure is PBIBDF-BT, the filling material is PBA. When acetone is selected as a cleaning fluid to dissolve PBA, the molecular weight of PBIBDF-BT is much higher than that of PBA, and PBIBDF-BT could not be dissolved by acetone.

It should be noted that, steps S104 and S105 need to use PBIBDF-BT and PBA solution, wherein the molar mass of PBA is 2000 g/mol and the concentration of PBA can be within the range of 1-10 mg/ml; the molar mass of PBIBDF-BT is 58,852 g/mol and the concentration of PBIBDF-BT can be within the range of 1-10 mg/ml. Both PBA and PBIBDF-BT can select polymers as the solvents, wherein polymers can be, for example, chloroform, chlorobenzene, dichlorobenzene, trichlorobenzene, and methylbenzene, etc.

In step S104, the ink-jet printing and spin-coating can also be used to fill the strip gaps with PBA.

In step S105, the drop-coating method can also be used to deposit PBIBDF-BT.

In addition, when depositing PBIBDF-BT in step S805, PBIBDF-BT does not completely cover the $SiN_x$-PBA composite layer with some edges set aside. In this way, when the cleaning fluid is used to dissolve PBA in the subsequent step S06, the cleaning fluid could enter the $SiN_x$-PBA composite layer through the edges set aside and dissolve PBA.

Figure 11:
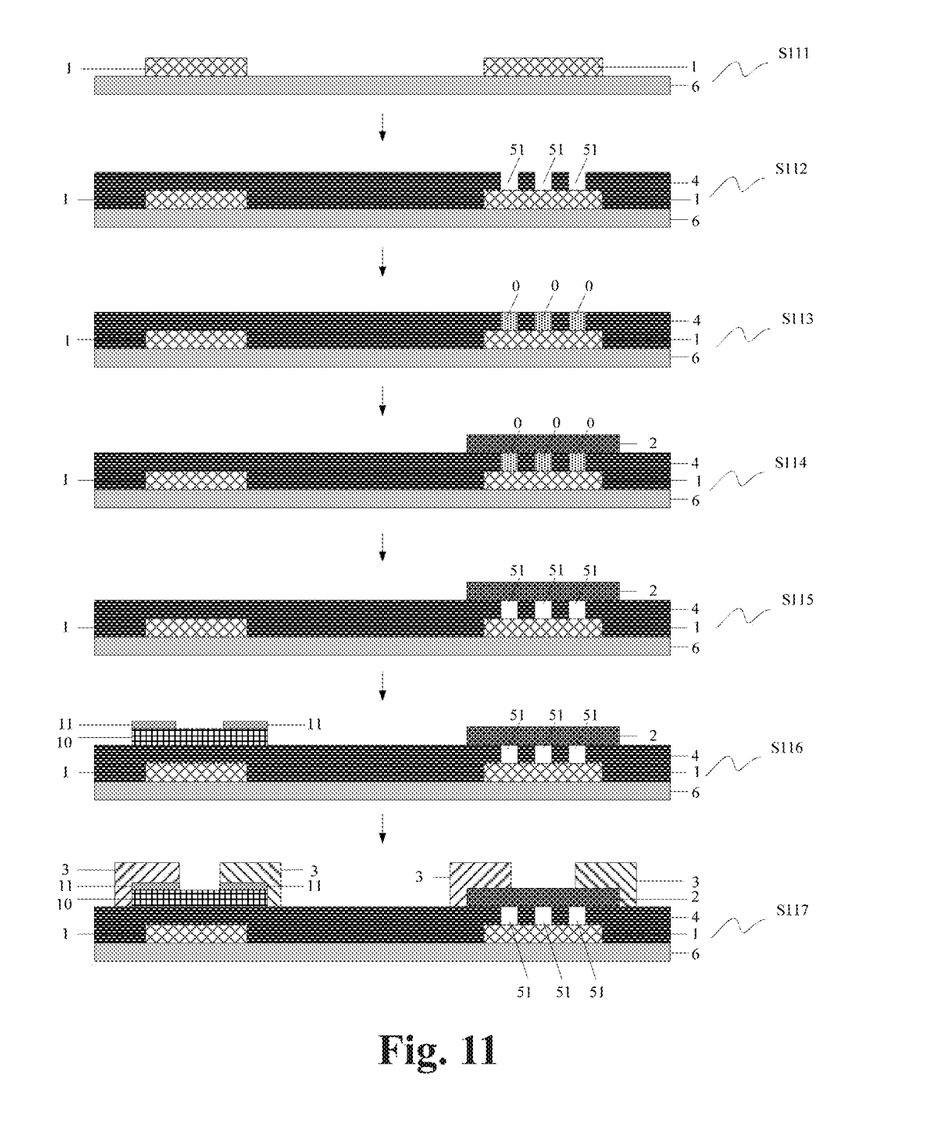
FIG. 11 is a structure diagram after the completion of each step in the manufacturing method of the display panel provided in some embodiments of the present disclosure.

Corresponding to the display panel provided in the embodiments of the present disclosure, the present disclosure discloses in the embodiments a manufacturing method of the display panel. The display panel provided in the embodiments of the present disclosure includes a display structure and a gas sensor. Since the gas sensor also includes an OTFT, the preparation process of the OTFT can also be integrated with the TFT preparation process in the display structure. As shown in FIG. 11, the preparation of the OTFT and display TFT includes the following steps:

S111, forming a gate electrode 1 on an base substrate 6;

S112, depositing $SiN_x$ 4, etching $SiN_x$ 4 in the area set in the gas sensor to form a plurality of strip gaps 51;

S113, filling the strip gaps 51 with PBA 0 by coating process; obtaining the $SiN_x$-PBA composite layer formed by PBA 0 and $SiN_x$ 4 in the area set in the gas sensor, S114, depositing PBIBDF-BT 2 on the $SiN_x$-PBA composite layer in the area set in the gas sensor;

S115, dissolving PBA 0 with acetone;

S116, depositing and etching amorphous silicon (a-Si) 10 in the area of the display structure, and depositing and etching electron-doped amorphous silicon ($n^+$ a-Si) 11 on the a-Si 10; and S117, forming a source-drain electrode 3.

In the above-described preparation steps of the display panel provided in the embodiments of the present disclosure, the first is to set the organic active layer of the OTFT, and then the active layer of the display TFT is set. In actual production, the active layer of the display TFT can be set first and the organic active layer of the OTFT can be set then. When the material of the active layer of the display TFT is the same as that of the organic active layer of the OTFT, the active layers of the display TFT and OTFT can also be set at the same time.

In conclusion, the present disclosure provides in the embodiments the structure and manufacturing method of the organic thin film transistor, the gas sensor and the related device, and sets a gap arranged in contact with the organic active layer and configured to accommodate the gas to be detected in the organic thin film transistor structure. When the organic thin film transistor structure is used to detect the gas concentration, the gas to be detected can enter the interior of the organic thin film transistor structure through the gap and the contact area between the gas to be detected and the organic active layer is increased, thus the contact area between the gas to be detected and the carrier migration interface is also increased. Accordingly, the sensitivity of the organic thin film transistor structure to detect the concentration of the gas to be detected and the detection effect on gas concentration are improved.

Obviously, technicians in this field can make various changes and variations to the present disclosure without breaking away from the essence and scope of the present disclosure. In this way, if the changes and variations disclosed herein fall within the scope of the claims of the present disclosure and its equivalent, the present disclosure also intends to include such changes and variations.

The invention claimed is:

1. An organic thin film transistor structure, comprising:
a gate electrode;
an organic active layer overlapping mutually with the gate electrode in a thickness direction of the gate electrode;
a source-drain electrode connected with the organic active layer; and
a gate insulating layer which is between the gate electrode and the organic active layer, wherein the gate insulating layer comprises a gap arranged in contact with the organic active layer and configured to accommodate a gas to be detected;
wherein the gap comprises a plurality of strip gaps extending substantially in a same direction;
wherein the strip gaps overlap mutually with the organic active layer in a thickness direction of the organic active layer;
wherein spaces between any two adjacent strip gaps are same.

2. The organic thin film transistor structure according to claim 1, wherein the gap passes through the gate insulating layer in a thickness direction of the gate insulating layer.

3. The organic thin film transistor structure according to claim 1, wherein ends of the strip gaps along a length direction do not overlap with the organic active layer in the thickness direction of the organic active layer.

4. The organic thin film transistor structure according to claim 1, wherein the gate insulating layer further comprises a plurality of sub-insulating layers separated by the strip gaps; and spaces between any two adjacent sub-insulating layers are same.

5. The organic thin film transistor structure according to claim 1, wherein a material of the organic active layer is a donor-acceptor conjugated polymer PBIBDF-BT.

6. The organic thin film transistor structure according to claim 1, wherein a material of the gate insulating layer comprises silicon nitride.

7. The organic thin film transistor structure according to claim 1, wherein the gate insulating layer is on the gate electrode, the organic active layer is on the gate insulating layer, and the source-drain electrode is on the organic active layer.

8. A gas sensor, comprising the organic thin film transistor structure according to claim 1.

9. A display panel, comprising an array substrate, and the gas sensor according to claim 8 arranged in a non-display area of the array substrate.

10. A display device, comprising the display panel according to claim 9.

11. A manufacturing method of the organic thin film transistor structure according to claim 1, including:
forming a pattern of a gate electrode;
forming a gate insulating layer on the pattern of the gate electrode;
etching the gate insulating layer to form a gap in the gate insulating layer for accommodating a gas to be detected;
filling the gap with a filling material to obtain a composite layer formed by a filling material and the gate insulating layer;
forming a pattern of an organic active layer and a pattern of a source-drain electrode on the composite layer; and
removing the filling material by a cleaning fluid.

12. The method according to claim 11, wherein the filling material includes poly (1, 4-butylene adipate).

13. The method according to claim 12, wherein cleaning fluid comprises one or a combination of following materials: acetone and ethyl acetate.

14. The gas sensor according to claim 8, wherein the gap passes through the gate insulating layer in a thickness direction of the gate insulating layer.

15. The gas sensor according to claim 8, wherein ends of the strip gaps along a length direction do not overlap with the organic active layer in the thickness direction of the organic active layer.

16. The gas sensor according to claim 8, wherein the gate insulating layer further comprises a plurality of sub-insulating layers separated by the strip gaps; and spaces between any two adjacent sub-insulating layers are same.

* * * * *